US008064221B2

(12) United States Patent
Kuroda

(10) Patent No.: US 8,064,221 B2
(45) Date of Patent: Nov. 22, 2011

(54) ELECTRONIC DEVICES FOR SURFACE MOUNT

(75) Inventor: Tomotaka Kuroda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 895 days.

(21) Appl. No.: 12/101,020

(22) Filed: Apr. 10, 2008

(65) Prior Publication Data

US 2008/0253102 A1 Oct. 16, 2008

(30) Foreign Application Priority Data

Apr. 12, 2007 (JP) ................. 2007-104666

(51) Int. Cl.
*H01L 41/08* (2006.01)
(52) U.S. Cl. ........ 361/803; 361/760; 361/774; 361/807; 361/809; 257/678; 257/724; 257/738; 257/778; 257/779; 310/344; 310/348; 438/108; 438/612; 438/615; 174/255; 174/260
(58) Field of Classification Search .................. 361/736, 361/743, 746, 748, 760–767, 774, 779, 782–784, 361/803, 807, 809, 813; 57/737, 738, 784, 57/786, 787, 788, 793, 687, 778; 174/250, 174/255, 251, 256–260; 310/340, 348, 366, 310/363, 344; 331/68, 158, 108 D
See application file for complete search history.

(56) References Cited

U.S. PATENT DOCUMENTS

| | | | | |
|---|---|---|---|---|
| 4,818,728 A * | 4/1989 | Rai et al. ........................ 438/108 |
| 5,367,765 A * | 11/1994 | Kusaka ............................ 29/840 |
| 5,525,855 A * | 6/1996 | Gotoh et al. .................. 310/344 |
| 5,726,501 A * | 3/1998 | Matsubara .................... 257/778 |
| 5,801,594 A * | 9/1998 | Muto et al. .................... 331/158 |
| 5,844,782 A * | 12/1998 | Fukasawa ...................... 361/774 |
| 5,973,931 A * | 10/1999 | Fukasawa ...................... 361/774 |
| 6,084,300 A * | 7/2000 | Oka ............................... 257/730 |
| 6,154,940 A * | 12/2000 | Onishi et al. ................. 29/25.35 |
| 6,165,885 A * | 12/2000 | Gaynes et al. ................ 438/612 |
| 6,188,138 B1 * | 2/2001 | Bodo et al. .................... 257/778 |
| 6,228,466 B1 * | 5/2001 | Tsukada et al. ............... 428/209 |
| 6,229,404 B1 * | 5/2001 | Hatanaka ........................ 331/68 |
| 6,304,151 B1 * | 10/2001 | Uehara et al. ............. 331/108 D |
| 6,461,953 B1 * | 10/2002 | Sakuyama et al. ........... 438/612 |
| 6,469,393 B2 * | 10/2002 | Oya .............................. 257/779 |
| 6,507,139 B1 * | 1/2003 | Ishino et al. .................. 310/348 |
| 6,667,664 B2 * | 12/2003 | Akagawa et al. ............... 331/68 |

(Continued)

FOREIGN PATENT DOCUMENTS

JP 2000200846 A * 7/2000

(Continued)

*Primary Examiner* — Michail V Datskovskiy
(74) *Attorney, Agent, or Firm* — Klarquist Sparkman, LLP

(57) ABSTRACT

Electronic devices are disclosed that allow for surface-mounting using solder while preventing solder from overflowing between external terminals of the electronic device, or between pads on a circuit board to which the external terminals are soldered. An exemplary electronic device has a base board made of an insulating material and having an outer surface comprising at least one external terminal for surface mounting of the device to the circuit board. A groove is defined at least part way around the external terminal on the outer surface. The groove accommodates overflowed solder and thus prevents unintended spread flow of the solder to locations that otherwise could cause short circuits and the like. The electronic device can include a resin board containing a thermoset resin, wherein the groove is formed by thermal or mechanical processing.

19 Claims, 7 Drawing Sheets

U.S. PATENT DOCUMENTS

| | | | |
|---|---|---|---|
| 6,778,029 B2 * | 8/2004 | Mizusawa | 331/68 |
| 6,897,142 B2 * | 5/2005 | Fujimori et al. | 438/615 |
| 6,917,142 B2 * | 7/2005 | Koyama et al. | 310/344 |
| 6,946,778 B2 * | 9/2005 | Miura | 310/348 |
| 7,180,181 B2 * | 2/2007 | Liu et al. | 257/724 |
| 7,452,797 B2 * | 11/2008 | Kukimoto et al. | 438/612 |
| 2004/0251527 A1 * | 12/2004 | Van Puymbroeck et al. | 257/678 |
| 2005/0087867 A1 * | 4/2005 | Liu | 257/738 |

FOREIGN PATENT DOCUMENTS

| | | | |
|---|---|---|---|
| JP | 2001144571 A | * | 5/2001 |
| JP | 2003-124773 | | 4/2003 |
| JP | 02004193230 A | * | 7/2004 |
| JP | 02006324936 A | * | 11/2006 |

* cited by examiner

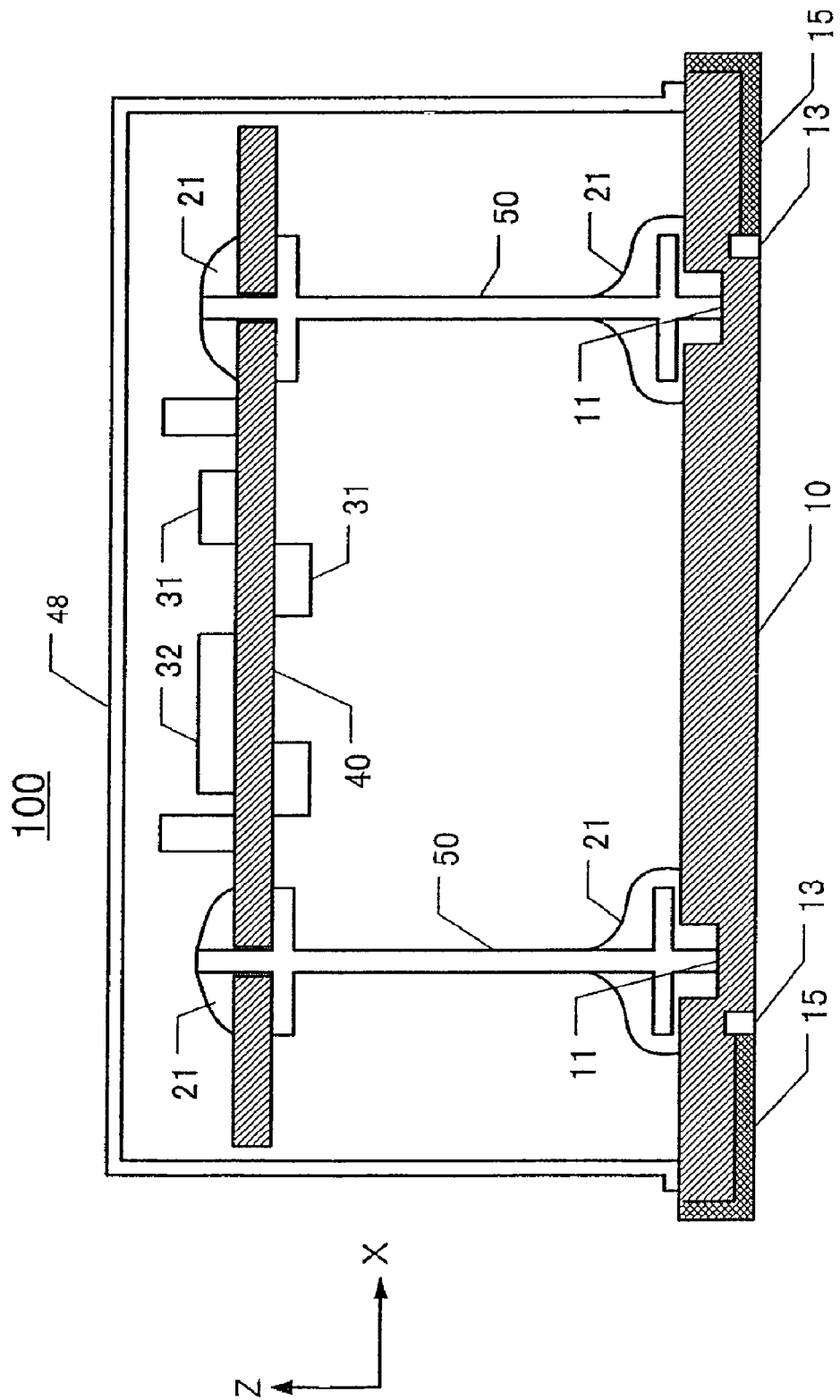

ELECTRONIC DEVICES FOR SURFACE MOUNT

CROSS-REFERENCE TO RELATED APPLICATION

This application claims priority to, and the benefit of, Japan Patent Application No. 2007-104666, filed on 12 Apr. 2007, in the Japan Patent Office, the disclosure of which is incorporated herein by reference in its entirety.

FIELD

The present invention relates to electronic devices for surface mount, more particularly to electronic devices in which short-circuiting by solder is prevented when the devices are mounted on a circuit board or the like.

DESCRIPTION OF THE RELATED ART

Crystal devices are widely known for use as frequency-controlling elements such as crystal units, oscillators, and filters. Crystal devices are mounted on various types of circuit boards of electronic devices including, but not limited to, communication devices. In recent years, crystal devices for surface mount have been developed for mounting on circuit boards with other electronic devices, such as resistors and capacitors. In general, the electronic devices are mounted, using a surface-mount machine, on the circuit board to which solder paste has been applied. Then, the board on which the electronic devices have been placed is conveyed through a reflow furnace to achieve soldering of the electronic devices to the board.

In many instances the electronic devices must be closely arranged on the circuit board to satisfy current demands of high integration and miniaturization. Consequently, pads (corresponding to respective external terminals) for the electronic devices are situated closely together on the circuit board. As miniaturization of electronic devices for surface mount has progressed, the distances between external terminals on the electronic devices have narrowed, requiring corresponding reductions of distances between external terminals on the board. Consequently, when soldering the electronic devices on the circuit board, solder tends to overflow between external terminals and cause short-circuits. Even in situations in which short-circuits do not form between individual external terminals, solder overflow may become ball-shaped and thus adversely affect other regions of the mount board.

FIG. 7 shows a piezoelectric oscillator 200, having a base board 210, mounted on a circuit board PB. Specifically, the circuit board PB includes a pad 115, and solder paste SOL has been applied to the pad 115. When the piezoelectric oscillator 200 enters a reflow furnace after being placed in a state in which a predetermined amount of solder SOL has been applied, a solder ball is formed between the base board 210 and the circuit board PB. Thus, short-circuiting may be produced between the external terminals 215.

If a somewhat small amount of solder paste is applied, the desired electrical connection between the external terminal 215 and the pad 115 may be insufficient. It is also difficult to detect whether or not connections between the electronic devices and the circuit board are satisfactory after performing solder reflow. Furthermore, if a connection fault should arise between an electronic device and the circuit board, the faulty connection state between the electronic device and wiring on the board may not be readily detected, which results in decreased product yield.

SUMMARY

To address the problems described above, an object of the present invention is to provide electronic devices for surface mount that prevent solder from overflowing between external terminals of the electronic device or between pads on a circuit board.

An electronic device for surface mount according to the first aspect comprises a base board made from an insulating material. An embodiment of the device includes at least one external terminal for surface mount on an outer surface. A groove is formed around the external terminal on a surface to be mounted on the printed circuit board. With this embodiment, even when solder is applied to a circuit board in a somewhat large amount during surface mounting, any overflowed solder enters the groove. Hence, short-circuiting between external terminals is much reduced.

A base board on the electronic device for surface mount according to the second aspect comprises a resin board made of a thermoset resin. The groove is formed by thermal or mechanical processing. By making the base board on the electronic device as a thermoset resin board, the groove can be formed by thermal processing, e.g., laser processing. If mechanical processing is used, the groove can be formed by drilling or routing, for example.

A base board on the electronic device for surface mount according to the third aspect comprises a ceramic board. The groove is formed by embossing or stamping, for example. The external terminals can be printed using metallized ink. By making the base board on the electronic device of ceramic, the groove may be formed by embossing or stamping before performing calcination, followed by metallization to form the external terminals.

With an electronic device for surface mount according to the fourth aspect, the depth of the groove is from 0.1 mm to 80% of the thickness of the base board. By staying within this range, solder overflow is satisfactorily arrested. If the groove depth exceeds 80% of the thickness of the base board, the base board becomes too weak for adequate durability.

With an electronic device for surface mount according to the fifth aspect, the width of the groove is from 0.1 mm to 2.0 mm. By staying within this range, solder overflow is satisfactorily arrested.

The electronic devices can include crystal oscillators and crystal units. Crystal oscillators are categorized as large-sized among electronic devices. Consequently, a rather large amount of solder is applied to the circuit board. The present invention is especially advantageous for this application.

Electronic devices for surface mount according to the present invention advantageously prevent solder from overflowing between external terminals of the electronic device or between corresponding pads on a circuit board to which the electronic devices are mounted.

BRIEF DESCRIPTION OF THE DRAWINGS

FIG. 1 is a cross-sectional view of an exemplary surface-mount piezoelectric oscillator 100.

DESCRIPTION OF PREFERRED EMBODIMENTS

Figure 2A:
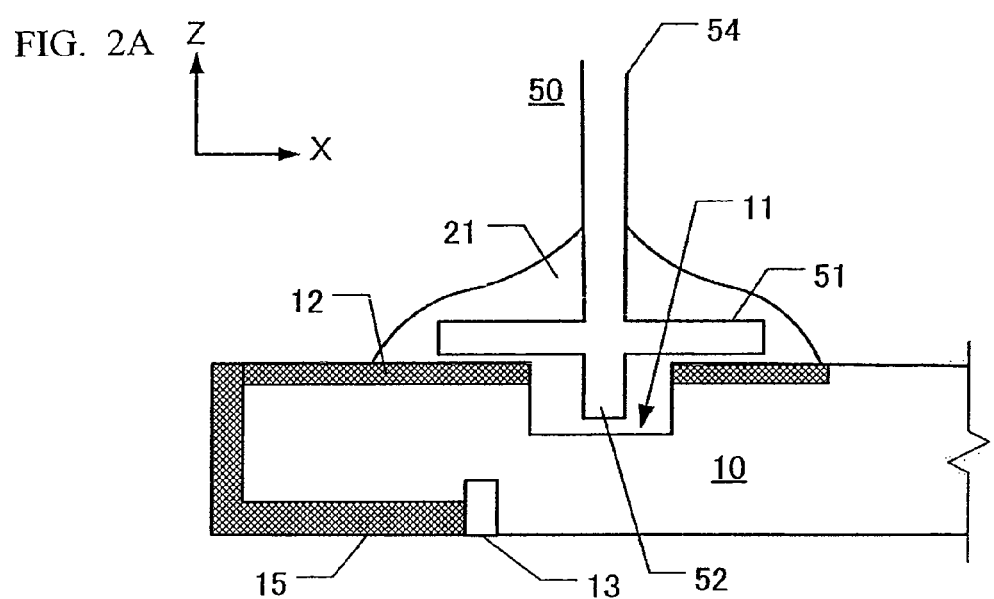
FIGS. 2A and 2B are elevational and plan views of a base board with external terminals.

The invention is described in connection with representative embodiments, with reference to the drawings.

Construction of Piezoelectric Oscillator

FIG. 1 is a cross-sectional view of an embodiment of a surface-mounted, high-stability piezoelectric oscillator 100 of the temperature-controlled type (hereinafter referred to as a "piezoelectric oscillator"). The piezoelectric oscillator 100 comprises a base printed circuit board 10 (called a "base board") and a sub printed circuit board 40. The base board 10 is made of an insulating material. On the sub printed circuit board 40 are mounted a temperature-control circuit and/or electronic components 31 for an oscillation circuit. Also mounted to the sub printed board 40 is a crystal-vibrating 32 affixed using conductive adhesive 21. On the under-surface of the base board 10, external terminals 15 are arranged in multiple (e.g., four or six) places. The external terminals facilitate mounting of the piezoelectric oscillator 100 on the surface of a circuit board PB (refer to FIG. 3). To visually observe a meniscus state of soldering after surface-mounting, the external terminals 15 can be electrically connected with the electronic component 31 or the crystal-unit 32 by plated wiring or by lead wires on the surface of the base board 10.

Also mounted to the base board 10 are first ends of respective metal supports 50 made of brass or the like. The first ends are inserted in recesses 11 and affixed using conductive adhesive 21. Opposing second ends of the metal support 50 are affixed to the sub printed circuit board 40 using conductive adhesive 21. The entire assembly is covered with a metal case 48 so as to seal the two-tiered base board 10 and sub printed circuit board 40. The piezoelectric oscillator 100 having such construction generally has a size from approximately 3 mm square to approximately 50 mm square.

Figure 2B:
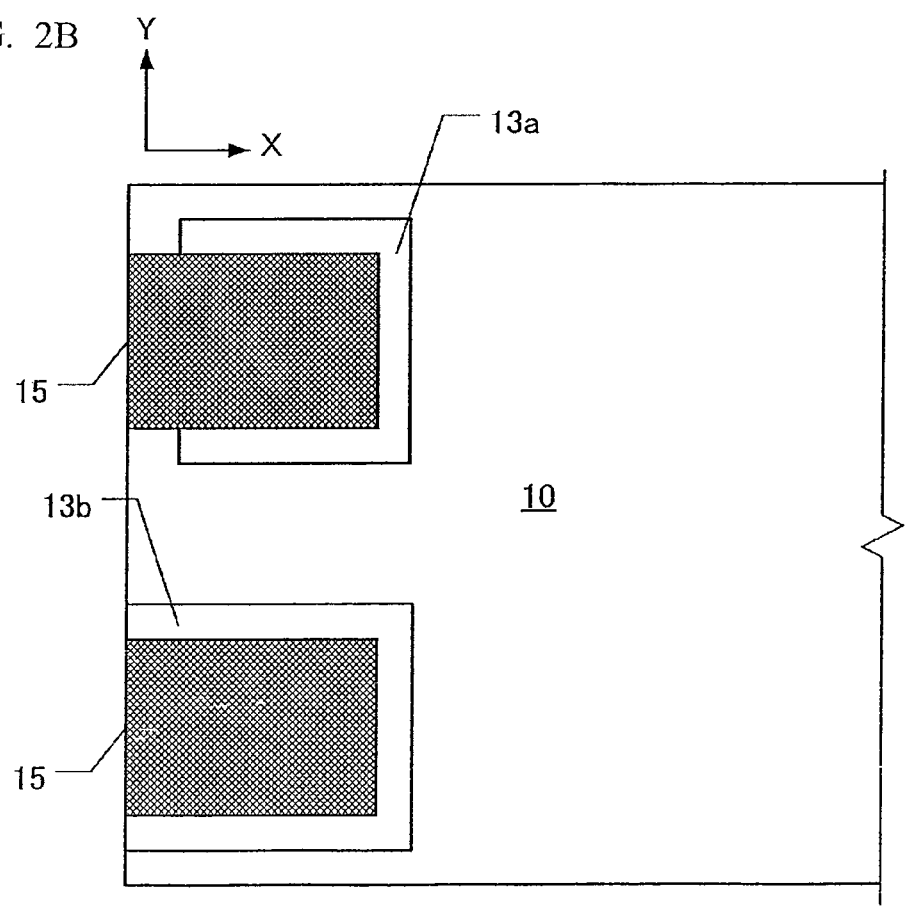

FIGS. 2A-2B depict the base board 10 and external terminal 15. FIG. 2A is an enlarged view showing the metal support 50 affixed to the base board 10, and also showing an external terminal 15. FIG. 2B shows the under-surface of the base board 10.

As shown in FIG. 2A, the metal support 50 includes a flange 51 and a shaft 54. The shaft 54 has a shank 52 extending from the flange 51. The diameter of the shaft 54 is approximately 0.03 mm to approximately 1 mm, and the diameter of the flange 51 is approximately 0.04 mm to approximately 3 mm. The flange 51 may have a diameter of approximately twice the diameter of the shaft 54.

The recess 11 is formed in the base board 10 such that the shank 52 may be inserted therein. The base board 10 is made of a glass-epoxy laminate or other insulating material. The thickness of the base board 10 is approximately 0.6 mm to approximately 3 mm, and the depth of the recess 11 is approximately 90% to approximately 30% of the thickness of the base board 10. Alternatively, the base board 10 can be made of an insulating material other than glass-epoxy laminate, such as a thermoset resin for glass cloth or glass non-woven fabric base material, an epoxy-resin laminate, a composite laminate, a paper-base epoxy-resin laminate, or a paper-base phenolic resin laminate. Recess or groove processing may be easily applied to these various materials by laser processing, drilling, routing, or the like.

The diameter of the recess 11 desirably is smaller than the diameter of the flange 51, and equal to or larger than the diameter of the shank 52. The recess 11 can be formed in the base board 10 using a flat router in the edge. Copper plating 12 is applied around the recess 11. The external terminal 15 and the copper plating 12 are electrically connected to each other. The flange 51 of the metal support 50 and the copper plating 12 are affixed using the conductive adhesive 21.

The groove 13 extends at least part way around the external terminal 15. In this regard, the groove 13a is formed only in the under-surface of the base board 10 destined to be surface mounted on the circuit board PB (refer to FIG. 3). The groove 13a does not extend up the side surface in this embodiment. The groove 13 is configured to facilitate visual observation of a meniscus state of solder on the external terminal 15 from the side surface of the piezoelectric oscillator 100.

The groove 13b is formed entirely in the under-surface of the circuit board PB because processing is easily applied to such end. The depth of the grooves 13 (13a and 13b) ranges from 0.1 mm to 80% of the thickness of the base board 10. The width of the groove 13 is 0.1 mm to 2.0 mm. With these combinations of depth and width of the groove 13, solder overflow is suppressed in the groove 13, especially considering the size of the surface-mount piezoelectric oscillator 100. (Solder overflow is still dependent on the amount of solder SOL applied to the circuit board PB, but this variable can be controlled.) In this embodiment, solder overflow is suppressed by flow of excess solder into the groove 13a or into the groove 13b, or into both grooves.

Mounting Piezoelectric Oscillator on Circuit Board

Figure 3A:
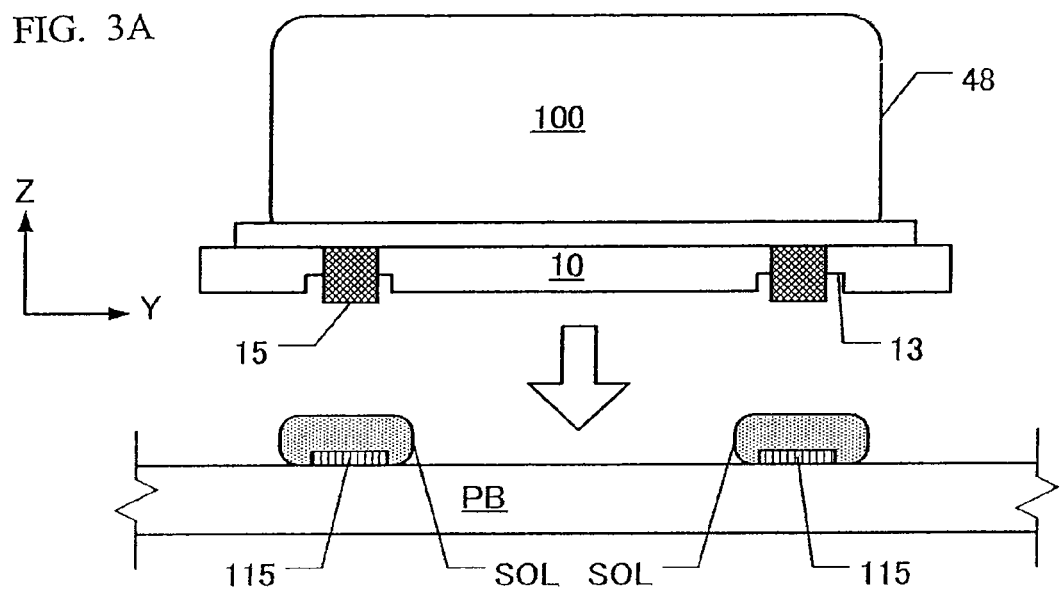
FIGS. 3A and 3B are elevational views of a piezoelectric oscillator being mounted on a circuit board.
Figure 3B:
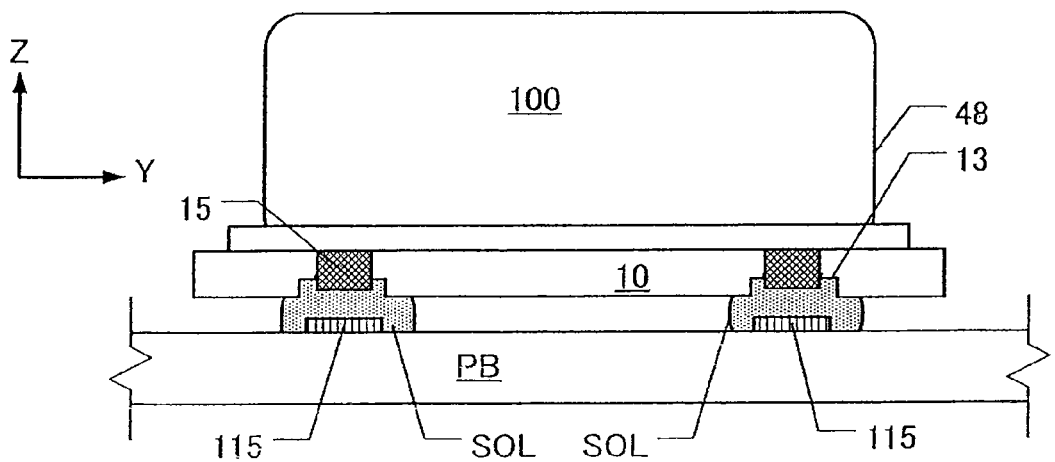

FIGS. 3A-3B show a piezoelectric oscillator 100 being mounted on the circuit board PB. FIG. 3A is a side view of the piezoelectric oscillator 100 before mounting, and FIG. 3B is a side view of the piezoelectric oscillator 100 after mounting. In FIG. 3A pads 115 are formed on a circuit board PB on which an electronic device or the like is mounted. The pads 115 form respective parts of a circuit. Solder SOL is applied to the pads 115 by application of a solder paste followed by passage through a reflow furnace of infrared type or hot-air type (not shown).

Solder is usually applied to the pads 115 at a predetermined thickness by application of solder paste SOL using a squeegee (not shown) that urges the paste through a perforated metal mask made from stainless steel (not shown). Then, the piezoelectric oscillator 100 is mounted to regions in which the solder SOL has been applied. The mounting of the piezoelectric oscillator 100 is usually performed by a numerically controlled (NC) surface-mounting machine.

As shown in FIG. 3B, during mounting of the piezoelectric oscillator 100, superfluous solder SOL may enter the groove 13. This flow into the groove prevents formation of solder balls or the like even if a somewhat excessive amount of the solder paste is transferred to the pads 115. A solder resist could be formed between the external terminals 15 to avoid generating short-circuits between the external terminals. However, with the depicted embodiment, the need for solder resist is eliminated because the grooves accommodate the excess solder.

The shape of the external terminal 15 can be similar to conventional shapes. The external terminals 15 on the under-surface of the base board 10 can extend up the side surfaces of the base board 10. This configuration allows visual observations of a meniscus state of soldering.

Construction of Crystal Oscillator

Figure 4A:
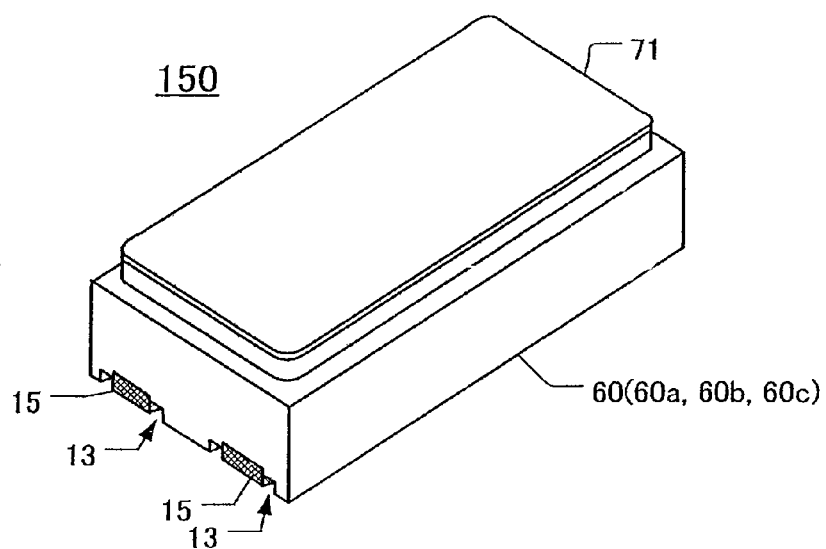
FIGS. 4A, 4B, and 4C are perspective, elevational, and plan views, respectively, of a crystal oscillator.
Figure 4B:
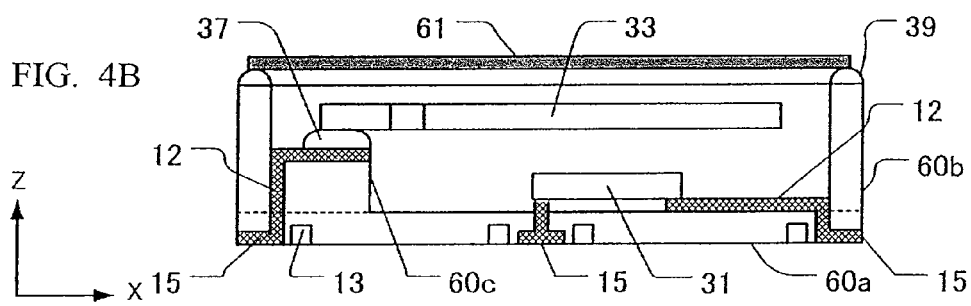
Figure 4C:
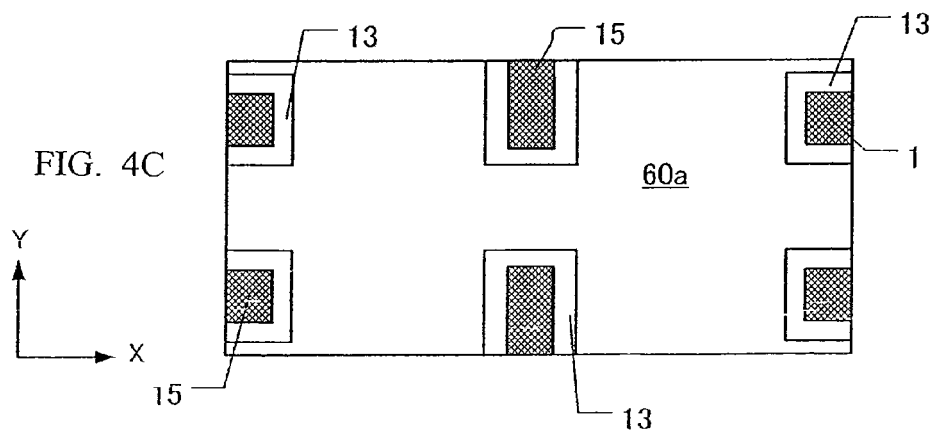

A crystal oscillator 150 is now described with reference to FIGS. 4A-4C. FIG. 4A is an overall perspective view; FIG. 4B is a cross-sectional view; and FIG. 4C is a top view with the metal lid 61 removed. The crystal oscillator 150 is a surface-mount type, comprising an insulating ceramic package 60 and a metal lid 61 that covers the package. The metal lid 61 desirably is made of Kovar (iron (Fe)/nickel (Ni)/cobalt (Co) alloy). The ceramic package 60 comprises a bottom ceramic layer 60a, a wall ceramic layer 60b, and seat ceramic layer 60c. These layers are punched from green sheets formed from a slurry containing ceramic powder including alumina as a main material, a binder, and the like. Instead of using ceramic powder containing alumina as the main ingredient to form the material of the ceramic package 60, any of various other materials can be used such as glass ceramic, zero X-Y shrinkage glass ceramic substrate, aluminum nitride, mullite, or the like. As understood from FIG. 4B, the package 60 constructed from the ceramic layers 60a-60c forms a cavity. The electronic component(s) 31 and/or tuning-fork type crystal-vibrating piece 33 is mounted in the cavity.

Copper plating 12, electrically connected with the electronic component(s) 31, is formed in a portion of the top surface of the seat ceramic layer 60c. At least two external terminals 15, formed in the lower surface of the ceramic package 60, are mounted on the surfaces of the pads 115 of the circuit board PB. The copper plating 12 connects to the external terminals 15. A metallized layer is provided on the upper surface of the wall ceramic layer 60b. A sealing material 39, made from a low-temperature-brazing filler metal, is formed on the metallized layer for bonding the metal lid 61. The wall ceramic layer 60b and the metal lid 61 are welded together by the sealing material 39.

The tuning-fork type crystal-vibrating piece 33 has, in its proximal portion, an adhesion region intended to be electrically connected using conductive adhesive 37. Specifically, copper plating 12, electrically connected with an external electrode, is formed on the seat ceramic layer 60c, and the proximal end of the tuning-fork type crystal-vibrating piece 33 is bonded to the seat ceramic layer 60c using the conductive adhesive 37. As affixed, the crystal-vibrating piece extends parallel to the bottom ceramic layer 60a and produces a predetermined vibration.

As disclosed in FIGS. 4A-4C, a groove 13 is formed around the external terminals 15 of the crystal oscillator 150. Consequently, when mounting the crystal oscillator 150 on the circuit board PB, any superfluous solder SOL flows into the groove 13. Hence, even if an unintended larger amount of solder paste is applied to the pads 115 (e.g., using a squeegee), a solder ball or the like is not formed, and short-circuits are avoided.

Manufacture of Bottom Ceramic Layer

Figure 5A:
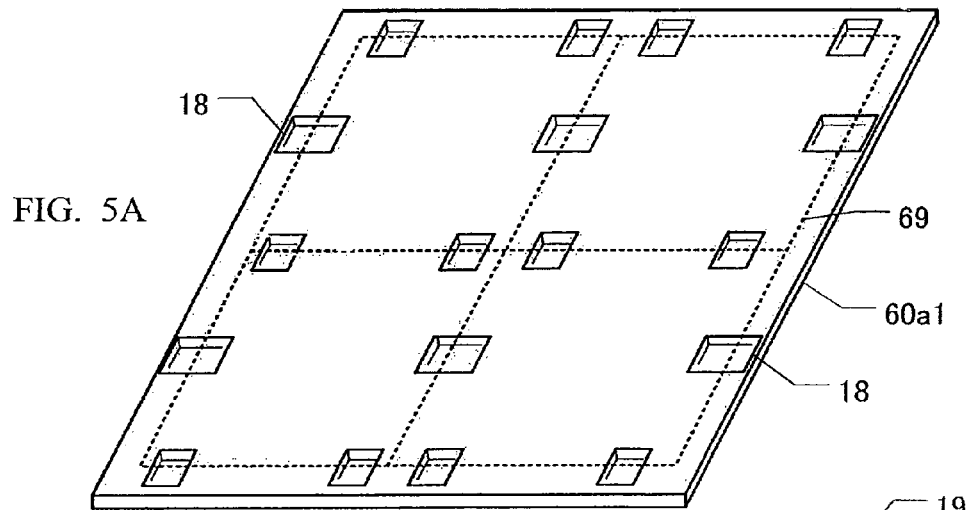
FIGS. 5A-5D depict exemplary steps in a method for manufacturing a ceramic layer for use a bottom layer.

FIGS. 5A-5D show a method for manufacturing the ceramic package 60, specifically the bottom ceramic layer 60a. FIG. 5A shows a first green sheet 60a1 made from alumina. The lattice-shaped broken lines 69 denote expected partition lines. In this example, a portion of the first green sheet enclosed by the parting lines 69 is a rectangle of 5 mm by 7 mm. To form the groove 13, as shown in FIG. 5A, rectangular through-holes 18 are formed in the first green sheet 60a1 along the parting lines 69 using a punching machine or the like. The thickness of the first green sheet 60a1 dictates the depth of the groove 13.

Figure 5B:
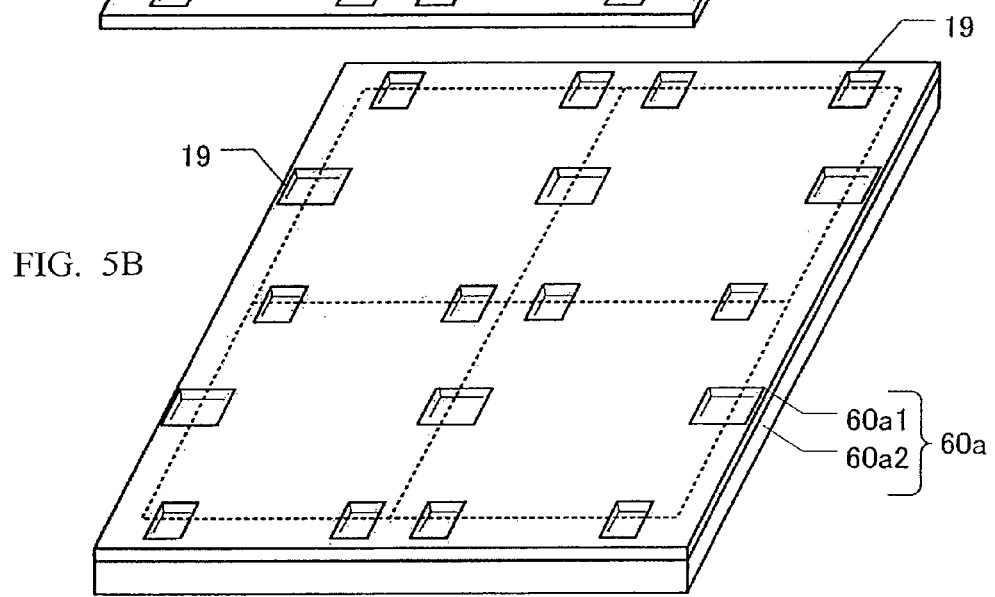

Next, a second green sheet 60a2 sized identically to the first green sheet 60a1 is prepared. The second green sheet 60a2 is a flat plate lacking the through-holes. Then, the first green sheet 60a1 and second green sheet 60a2 are stacked. Thus, as shown in FIG. 5B, the through-holes 18 become blind via-holes 19.

Figure 5C:
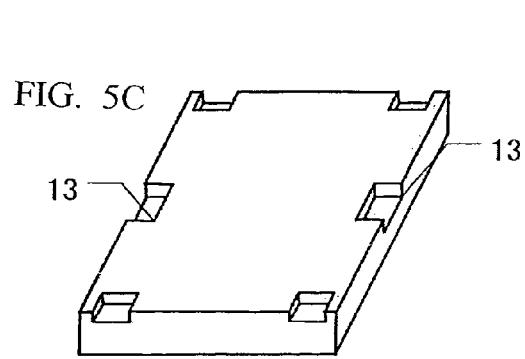
Figure 5D:
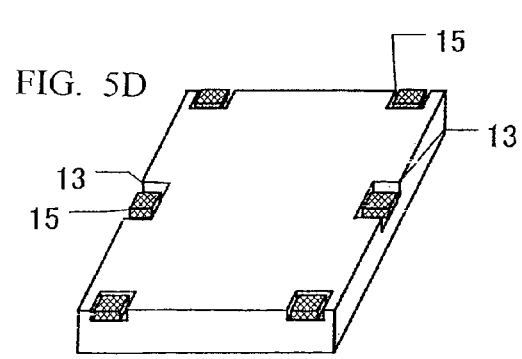

Next, when the stacked sheet is cut along the parting lines 69 to form multiple units each destined to become a bottom ceramic layer 60a having the overall configuration as shown in FIG. 5C. Then, when the wall ceramic layer 60b and seat ceramic layer 60c are stacked on and integrated with the bottom ceramic layer 60a, a pre-calcination ceramic package 60 is formed. Although the wall ceramic layer 60b and seat ceramic layer 60c are not shown in FIG. 5(D), printing is performed at the blind via-holes 19 of the bottom ceramic layer 60a during application of vacuum suction. Thus, the external terminals 15 are formed by screen printing of a conductive paste including tungsten, molybdenum, or the like. The screen printing is not performed to the entire blind via-holes 19. Rather, the conductive paste is applied only in the central portions of the blind via-holes 19 to form the grooves 13. Although not specifically described, this screen-printing technique is also performed to the copper plating 12 of the wall ceramic layer 60b and to the seat ceramic layer 60c.

The stacked structure formed as described above is calcinated for a predetermined time at approximately 1500° C. to form the ceramic package 60 having the grooves 13.

In the foregoing description, screen printing is performed after cutting along the parting lines 69. However, the ceramic package 60 may be produced by a process having a different other than that described above. For example, screen printing of the conductive paste may be performed to the large green sheet 60a before partition. Then the sheet is calcinated and cut along the parting lines 69.

The foregoing description pertained to the package 60 being made of ceramic. Alternatively, the package can be made of a filled resin, with the same grooves 13 being formed around the external terminals 15. Exemplary filled-resin materials are epoxy resin, bismaleimide-triazine (BT) resin, polyimide resin, glass epoxy resin, glass BT resin, and the like. With a resin package, the groove 13 may be formed by laser processing, drilling, routing, or the like.

In the foregoing description, the first green sheet 60a1 and the second green sheet 60a2 are stacked to form the bottom ceramic layer 60a. Alternatively, a boss, die, or the like defining a shape complementary to the shape of the groove 13 may be urged against a single green sheet to form the grooves 13.

Depth Profiles of Grooves

As explained above, the grooves 13 extend depthwise into the base board and can be formed by laser processing, drilling, routing, or the like to a base board made of a resin laminate. Alternatively, the grooves 13 can be formed by punching or similar method before calcining a ceramic base board.

Figure 6A:
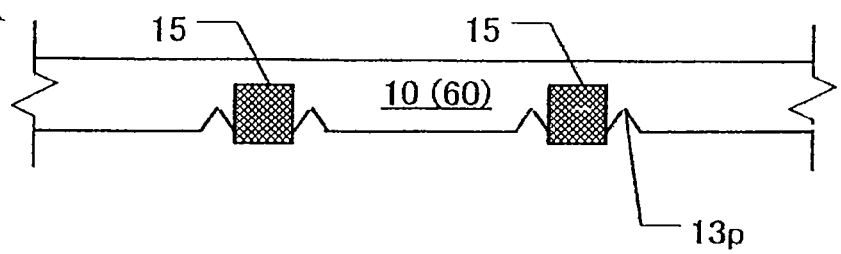
FIGS. 6A-6D depict representative cross-sectional shapes of grooves.

FIGS. 6A-6D show representative sectional profiles of the grooves 13. In FIGS. 1 to 5 described above, the sectional profile of the grooves 13 was rectangular. But, any of various other sectional profiles can alternatively be used. FIG. 6A depicts a triangular profile for the grooves 13. Such a profile can be formed easily by drilling or routing. However, if the width and the depth of a triangular-profiled groove 13 are the same as a corresponding rectangular groove, the volume of the triangular groove is less than of the rectangular groove. Hence, the triangular groove can accept less overflowing solder SOL than a rectangular groove having the same depth and width.

Figure 6B:
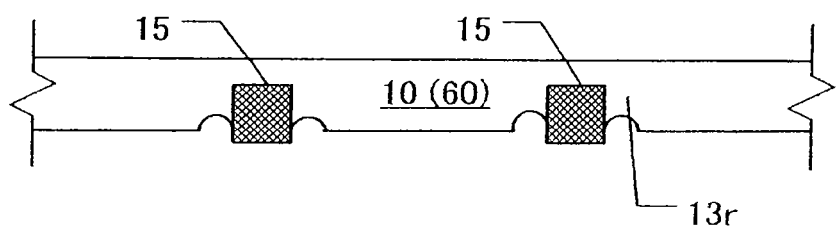

FIG. 6B shows a groove 13 having a sectional profile that is semi-circular. This profile is suitable if the grooves are formed by embossing.

Figure 6C:
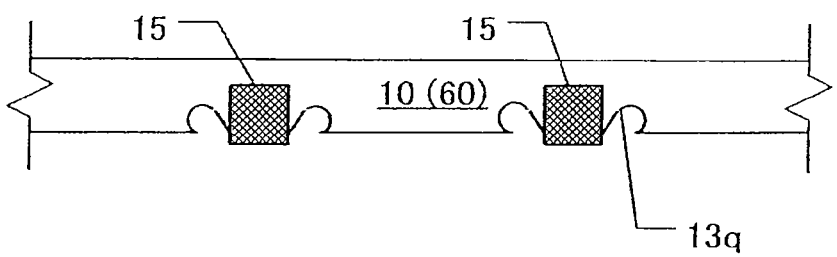

FIG. 6C shows a groove 13 that provides progressively larger cross-sectional area with increased depth. Although special routing or the like must be used to form such grooves, since the volume of the groove 13 increases with depth, the amount of overflowing solder SOL that can be accommodated in such a groove may be larger than with other types of grooves.

Figure 6D:
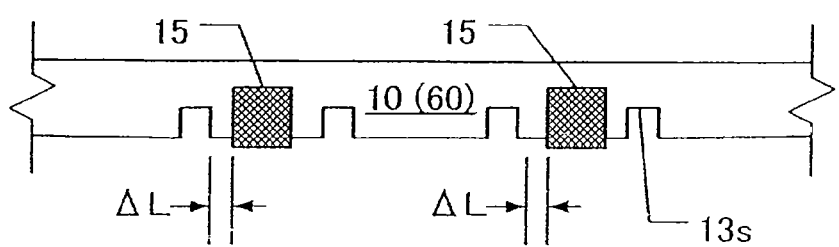
Figure 7:
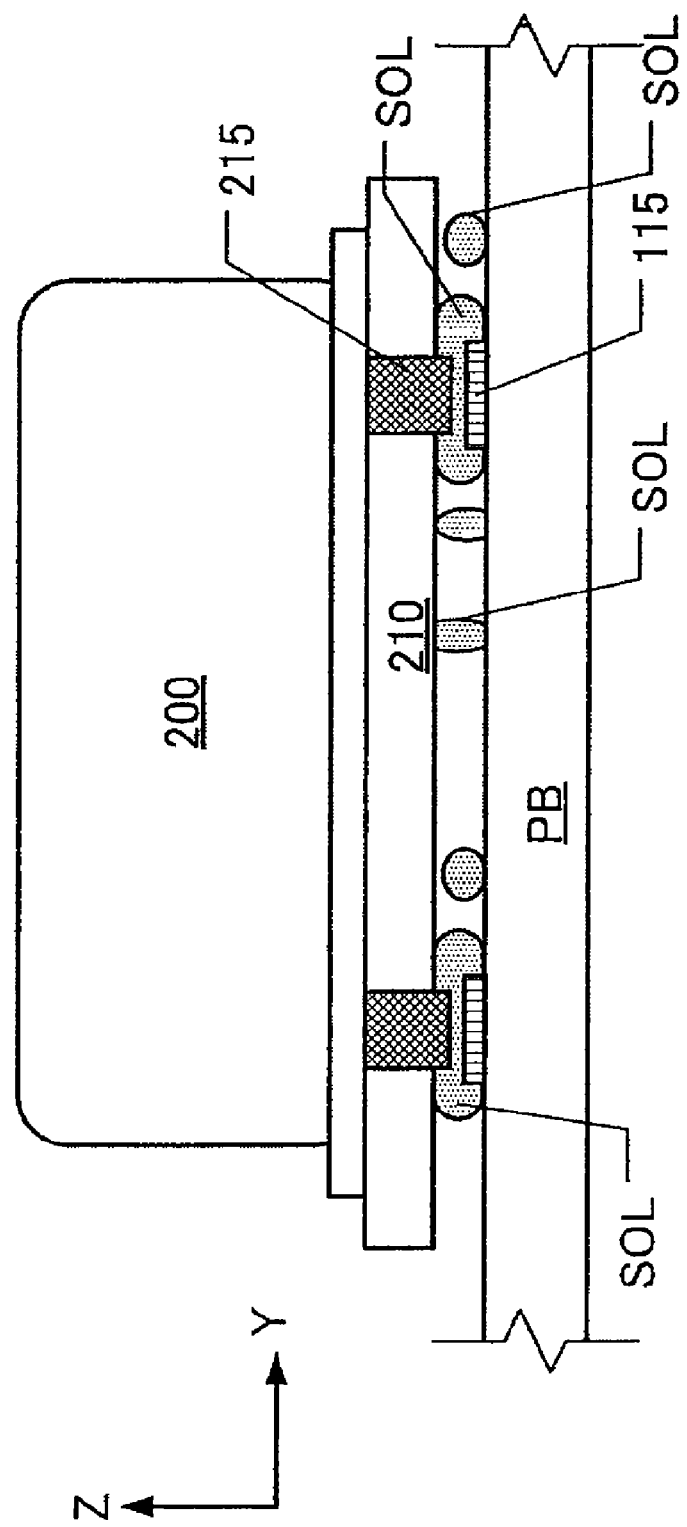
FIG. 7 is a side view of a conventional piezoelectric oscillator mounted on a circuit board.

FIG. 6D shows rectangular grooves 13 formed with shoulders (i.e., the grooves are separated from the external terminals 15 by a distance ΔL).

The grooves 13 described above are formed directly at the sides of the external terminals 15. However, the grooves need not be formed directly to the sides.

The grooves 13 described above formed as a single groove around each respective external terminal 15. Alternatively, multiple grooves (e.g., two) can be formed around the terminals.

The foregoing description has been in the context of mounting an electronic device, such as piezoelectric oscillator 100 or crystal oscillator 150, to a circuit board PB. This is not intended to be limiting. The principles described herein can be applied to other types of electronic devices, such as a package having Chip on Board (COB) structure, and Pin Grid Array (PGA) structure, or a Ball Grid Array (BGA) package. These various electronic devices are often manufactured using resin packages. Since a resin package has rich mechanical processability, grooves may be formed economically and with high precision using mechanical techniques such as drilling or routing.

The description has been in the context of crystal oscillators. Alternatively, a crystal unit may be used and, in particular, a large-sized device is preferable among electronic devices. Before applying the solder SOL, a solder resist may be applied to the circuit board PB between places where the solder SOL is to be applied.

What is claimed is:

1. An electronic device for surface-mounting on a printed circuit board, comprising:
    a base board made from an insulating material, the base board having an under-surface intended to face the printed circuit board when the electronic device is surface-mounted on the printed circuit board;
    at least one external terminal on the under-surface connectable to the printed circuit board when the device is surface-mounted to the printed circuit board; and
    a groove defined in the under-surface, at least part-way around the external terminal, the groove being separated from the external terminal by a shoulder.

2. The electronic device of claim 1, wherein the groove has sufficient capacity to accommodate flowing solder and contain the solder at the external terminal.

3. The electronic device of claim 1, wherein:
    the base board has a thickness; and
    the groove has a depth ranging from 0.1 mm to 80% of the thickness of the base board.

4. The electronic device of claim 3, wherein the groove has a width of 0.1 mm to 2.0 mm.

5. The electronic device of claim 1, wherein the groove has a width of 0.1 mm to 2.0 mm.

6. The electronic device of claim 1, wherein the groove extends around at least three sides of the external terminal.

7. The electronic device of claim 1, comprising multiple external terminals on the under-surface, each external terminal being at least part-way surrounded by a respective groove.

8. The electronic device of claim 1, wherein the base board is made of a thermoset resin.

9. The electronic device of claim 1, wherein the base board is made of a ceramic material.

10. The electronic device of claim 1, further comprising:
    a sub printed circuit board electrically connected to the base board;
    at least one electronic component mounted to and electrically connected to the sub printed circuit board;
    a cover enclosing, with the base board, the sub printed circuit board and the electronic component.

11. The electronic device of claim 10, wherein the at least one electronic component includes a crystal-vibrating piece or crystal oscillator.

12. A method for surface-mounting an electronic device, comprising:
    on an insulative base board, forming multiple external terminals on an under-surface of the base board;
    forming respective grooves relative to the external terminals such that the grooves at least partially surround the external terminals while being separated from the external terminals by respective shoulders, the grooves extending depthwise from the under-surface into the base board;
    mounting an electronic device to an upper surface of the base board;
    electrically connecting the electronic device to the external terminals;
    placing the base board relative to mounting pads on a printed circuit board such that the mounting pads are registered with the external terminals; and
    soldering the base board to a printed circuit board while allowing superfluous solder to enter the grooves.

13. The method of claim 12, wherein:
    the base board is made of a ceramic material; and
    the grooves are formed by embossing or stamping a ceramic material.

14. The method of claim 12, wherein the external terminals are made by printing respective locations on the under-surface using metallized ink.

15. The method of claim 12, wherein:
    the base board is made of a thermoset resin; and
    the grooves are formed by thermal or mechanical processing.

16. The method of claim 12, wherein electrically connecting the electronic device to the external terminals comprises mounting the electronic device to an upper surface of the base board.

17. The method of claim 12, wherein electrically connecting the electronic device to the external terminals comprises:
    mounting the electronic device to a sub board; and
    mounting the sub board to the base board in a manner by which the electronic device on the sub board is electrically connected to the external terminals.

18. The method of claim 12, further comprising:
    attaching walls to an upper surface of the base board, the walls surrounding the electronic device; and
    sealing a cover to the walls to enclose of the electronic device.

19. The method of claim 18, wherein the electronic device comprises a crystal oscillator or a crystal unit.

* * * * *